US009812328B2

(12) United States Patent
Singh et al.

(10) Patent No.: US 9,812,328 B2
(45) Date of Patent: Nov. 7, 2017

(54) METHODS FOR FORMING LOW RESISTIVITY INTERCONNECTS

(71) Applicant: Applied Materials, Inc., Santa Clara, CA (US)

(72) Inventors: Kaushal K. Singh, Santa Clara, CA (US); Er-Xuan Ping, Fremont, CA (US); Xianmin Tang, San Jose, CA (US); Sundar Ramamurthy, Fremont, CA (US); Randhir Thakur, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 13 days.

(21) Appl. No.: 15/189,768

(22) Filed: Jun. 22, 2016

(65) Prior Publication Data

US 2016/0372371 A1    Dec. 22, 2016

Related U.S. Application Data

(60) Provisional application No. 62/182,925, filed on Jun. 22, 2015.

(51) Int. Cl.
| | | |
|---|---|---|
| *H01L 21/4763* | (2006.01) | |
| *H01L 21/285* | (2006.01) | |
| *H01L 23/485* | (2006.01) | |
| *H01L 23/532* | (2006.01) | |

(52) U.S. Cl.
CPC ...... *H01L 21/28518* (2013.01); *H01L 23/485* (2013.01); *H01L 23/53209* (2013.01); *H01L 23/53219* (2013.01)

(58) Field of Classification Search
CPC ... H05K 1/028; H01L 23/5387; H01L 27/105; H01L 21/8229
See application file for complete search history.

(56) References Cited

U.S. PATENT DOCUMENTS

| | | | |
|---|---|---|---|
| 4,924,295 A | 5/1990 | Kuecher | |
| 5,940,693 A | 8/1999 | Maekawa | |
| 8,349,730 B2 | 1/2013 | Shih et al. | |
| 2002/0068444 A1* | 6/2002 | Bertrand | ............ H01L 21/28052 438/648 |
| 2006/0051596 A1 | 3/2006 | Jensen et al. | |
| 2009/0286382 A1* | 11/2009 | Huff | ........................ C23F 4/00 438/455 |

* cited by examiner

*Primary Examiner* — Elias M Ullah
(74) *Attorney, Agent, or Firm* — Patterson + Sheridan LLP

(57) ABSTRACT

Embodiments described herein generally relate to methods for forming silicide materials. Silicide materials formed according to the embodiments described herein may be utilized as contact and/or interconnect structures and may provide advantages over conventional silicide formation methods. In one embodiment, a one or more transition metal and aluminum layers may be deposited on a silicon containing substrate and a transition metal layer may be deposited on the one or more transition metal and aluminum layers. An annealing process may be performed to form a metal silicide material.

16 Claims, 6 Drawing Sheets

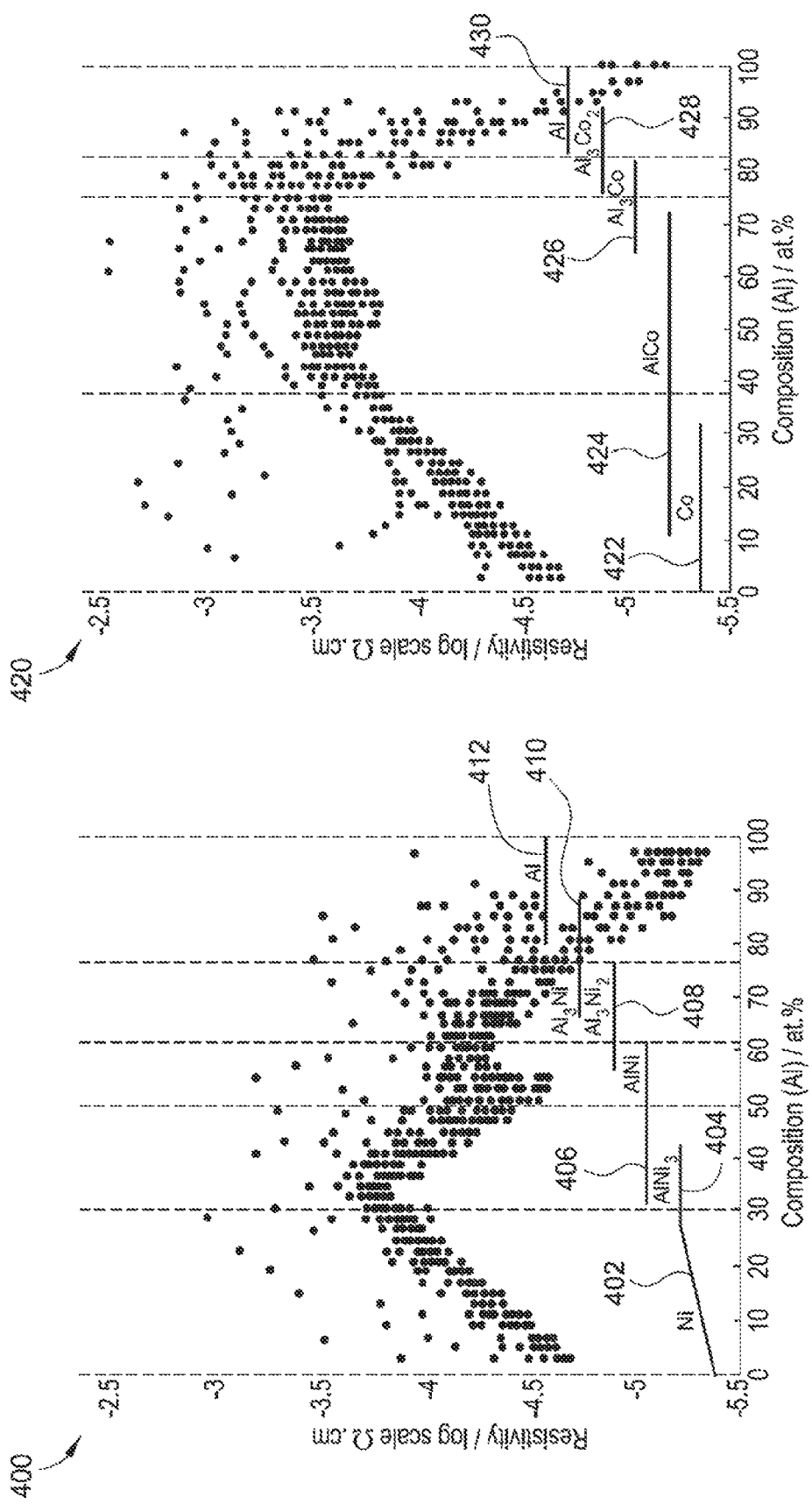

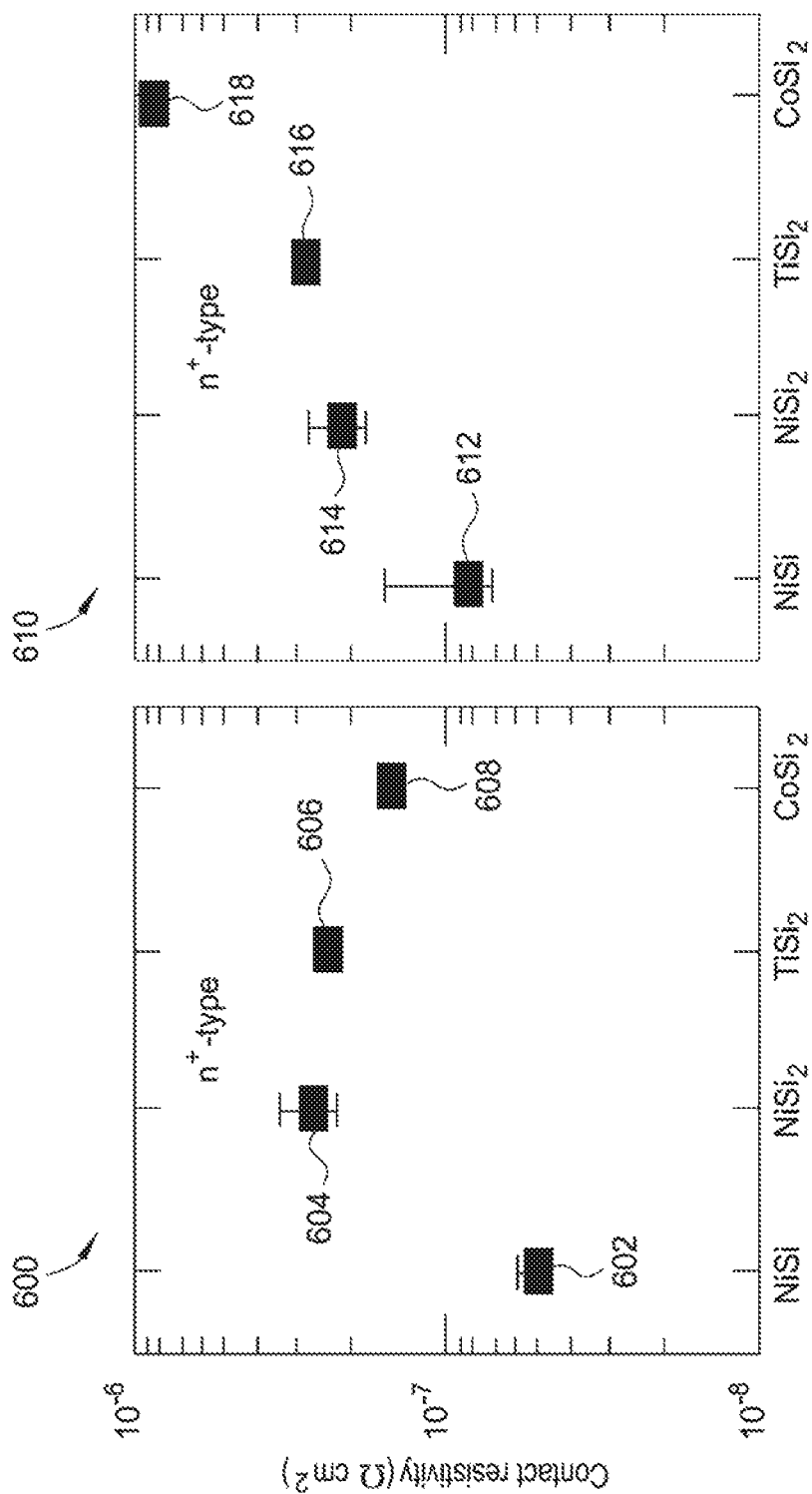

METHODS FOR FORMING LOW RESISTIVITY INTERCONNECTS

CROSS-REFERENCE TO RELATED APPLICATIONS

This application claims benefit to U.S. Provisional Patent Application No. 62/182,925, filed Jun. 22, 2015, the entirety of which is herein incorporated by reference.

BACKGROUND

Field

Embodiments of the present disclosure generally relate to methods for forming low resistivity interconnects. More specifically, embodiments described herein relate to ultra-thin laminar intermetallic films suitable for use as interconnect structures in semiconductor manufacturing processes.

Description of the Related Art

Integrated circuits have evolved into complex devices that can include millions of components, such as transistors, capacitors, and resistors on a single chip. The evolution of chip design continually requires faster circuitry and greater circuit densities. The demand for greater circuit densities necessitates a reduction in the dimensions of the integrated circuit components.

As the dimensions of the integrated circuit components are reduced, the materials used to fabricate such components increasingly affect the performance of the components. For example, in a device with a reduced feature width, device current typically remains constant or increases, which results in an increased current density on the features. Higher device densities and faster operating frequencies have created demand for a suitable material with low resistivity values compared to conventionally utilized aluminum for forming interconnect structures.

Copper materials have also been used in conventional interconnect schemes because copper generally exhibits relatively low resistivity and high conductivity. However, with advanced technology nodes, such as sub-10 nm node architectures, the resistivity of copper increases as line widths shrink below about 50 nm and approach the mean free path of electrons in copper (39 nm). The increase in resistivity may be due, at least in part, to electron scattering at the surface of the line and at grain boundaries of the copper material. In addition, barrier layers are utilized with copper interconnects to prevent undesirable diffusion of the copper into underlying materials, such as low-k materials. However, barrier layers may undesirably increase the resistivity associated with the copper interconnect scheme. As such, copper materials may not be suitable for advanced technology nodes.

Accordingly, what is needed in the art are materials and methods for forming contact and interconnect structures.

SUMMARY

In one embodiment, a silicide formation method is provided. The method includes depositing one or more first layers on a silicon containing substrate. The one or more first layers may comprise a transition metal and aluminum and a second layer comprising a transition metal may be deposited on the one or more first layers. The substrate may be annealed at a temperature of less than about 500° C. to form a silicide material.

In another embodiment, a silicide formation method is provided. The method includes depositing one or more first layers on a silicon containing substrate. The one or more first layer may comprise nickel and aluminum and a first annealing process may be performed on the substrate. A second layer comprising nickel may be deposited on the one or more first layers. A second annealing process may be performed at a temperature of less than about 500° C. to form a silicide material.

In yet another embodiment, a silicide formation method is provided. The method includes removing an oxide material layer from a silicon containing substrate and depositing an aluminum material layer on the silicon containing substrate. A first nickel material layer may be deposited on the aluminum material layer and a first annealing process may be performed at a temperature of less than about 500° C. A second nickel material layer may be deposited on the first nickel material layer and a second annealing process may be performed at a temperature of less than about 500° C. to form a nickel silicide material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 4A is a graph illustrating resistivity as a function of aluminum content for aluminum nickel materials at various thicknesses according to embodiments described herein.

FIG. 4B is a graph illustrating resistivity as a function of aluminum content for aluminum cobalt materials at various thicknesses according to embodiments described herein.

FIG. 6A is a graph illustrating resistivity values of silicide materials for an n-type NMOS device.

FIG. 6B is a graph illustrating resistivity values of silicide materials for a p-type NMOS device.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods for forming silicide materials. Silicide materials formed according to the embodiments described herein may be utilized as contact and/or interconnect structures and may provide advantages over conventional silicide formation methods. In one embodiment, a one or more transition metal and aluminum layers may be deposited on a silicon containing substrate and a transition metal layer may be deposited on the one or more transition metal and aluminum layers. An annealing process may be performed to form a metal silicide material.

Advantageously, silicide materials, such as monosilicide materials, may be formed at temperatures less than about 500° C. Lower temperature silicide material formation may provide for advantages when considering the thermal budgets of various other materials in semiconductor devices. Moreover, the methods described herein provide for improved selectivity in forming contact and interconnect structures with desired resistivity values. At advanced technology nodes, such as sub-10 nm or sub 7 nm nodes, methods provided herein may also be utilized to form silicide materials which are suitable for use as a barrier-less interconnect structure. Accordingly, device resistivity may be reduced by utilizing silicide materials formed according to the embodiments of this disclosure.

Figure 1:
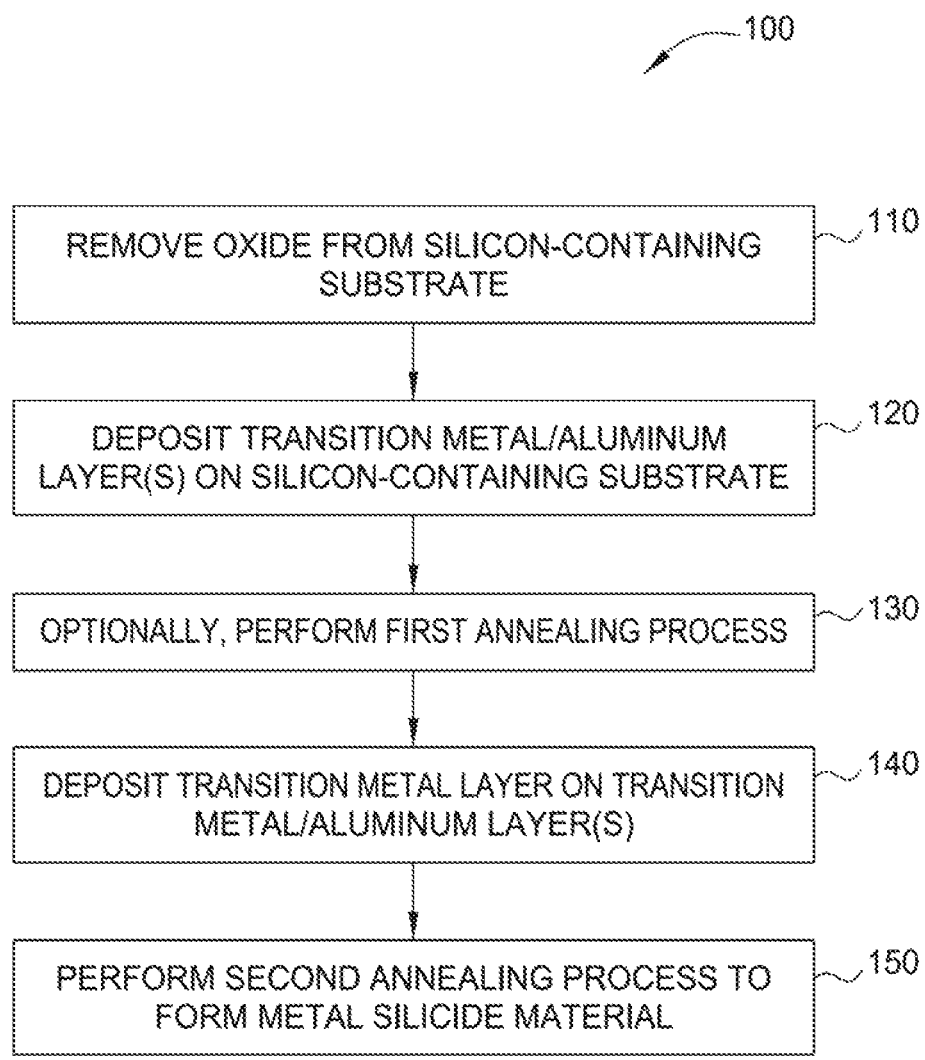
FIG. 1 illustrates operations of a method for forming a silicide material according to embodiments described herein.

FIG. 1 illustrates operations of a method 100 for forming a silicide material according to embodiments described herein. At operation 110, an oxide may be removed from a silicon containing substrate. The substrate may be a crystalline silicon substrate, such as a single crystalline silicon material, and may be substantially pure silicon or dopants may be incorporated into the substrate. In certain embodiments, the substrate may be a silicon on insulator substrate. Generally, an oxide material, such as a native oxide, may be present on the surface of the substrate. An oxide removal process, such as an etching process may be performed to remove the oxide material. In one embodiment, a hydrogen fluoride cleaning process may be performed to remove the oxide material from the substrate to prepare the substrate for subsequent processes.

At operation 120, transition metal/aluminum layer(s) may be deposited on the silicon containing substrate. Suitable examples of transition metals include nickel, cobalt, ruthenium, iridium, titanium, and tungsten, among others. It is also contemplated that various combinations of transition metals may be deposited. For example, an aluminum based ternary alloy transition metal/aluminum layer(s) may have the general formula (metal$_x$metal$_y$Al$_z$). Generally, the as deposited transition metal/aluminum layer(s) may be considered alloys, and in some embodiments, intermetallic materials. In one embodiment, a single transition metal/aluminum layer is deposited on the substrate. In another embodiment, an aluminum material layer is deposited on the substrate and a transition metal material layer is deposited on the aluminum material layer. Alternatively, the transition metal material layer may be deposited on the substrate and the aluminum material layer may be deposited on the transition metal material layer. It is also contemplated that multiple transition metal material layers and aluminum material layers may be deposited in an alternating fashion on the substrate.

Various deposition methods may be utilized to deposit the transition metal/aluminum layer(s). Suitable deposition methods include chemical vapor deposition (CVD), plasma enhanced chemical vapor deposition (PECVD), atomic layer deposition (ALD), plasma enhanced atomic layer deposition (PEALD), physical vapor deposition (PVD), and various evaporation methods, such as ultra high vacuum (UHV) e-beam evaporation methods. In one embodiment, the transition metal/aluminum layer(s) are deposited by a UHV e-beam evaporation process at about room temperature. In this embodiment, the UHV e-beam evaporation process may be utilized to co-evaporate the transition metal and aluminum on the silicon containing substrate. The co-evaporated transition metal/aluminum layer may have a material composition between about transition metal$_{0.9}$/aluminum$_{0.1}$ and about transition metal$_{0.1}$/aluminum$_{0.9}$, such as between about transition metal$_{0.3}$/aluminum$_{0.7}$ and about transition metal$_{0.7}$/aluminum$_{0.3}$, for example, about transition metal$_{0.5}$/aluminum$_{0.5}$.

Alternatively, the UHV e-beam evaporation process may be utilized to form a layered stack of transition metal/aluminum or aluminum/transition metal on the silicon containing substrate. In this embodiment, a transition metal material layer is deposited on the substrate and an aluminum material layer is deposited on the transition metal material layer. Alternatively, the aluminum material layer may be deposited on the substrate and the transition metal material layer may be deposited on the aluminum material layer.

At operation 130, an annealing process may be optionally performed. If the annealing process is performed, the annealing process may be considered a first annealing process. As such, the first annealing process may be performed on the transition metal/aluminum layer(s) deposited on the substrate. In one embodiment, the first annealing process may be performed in-situ in the processing apparatus utilized to deposit the transition metal/aluminum layer(s). In another embodiment, the substrate may be transferred to a thermal processing chamber and the first annealing process may be performed. The first annealing process may be performed at a temperature of less than about 500° C., such as between about 200° C. and about 400° C. The first annealing process may be performed for an amount of time between about 60 seconds and about 1 hour, such as between about 10 minutes and about 30 minutes, for example, about 20 minutes.

It is contemplated that the first annealing process may be utilized to improve various metallic bonding characteristics of the transition metal/aluminum layer(s). For example, in embodiments drawn to layered transition metal/aluminum, the first annealing process may be performed to promote alloying of the materials to form a more homogenous alloy instead of more distinct layers.

At operation 140, a transition metal layer may be deposited on the transition metal/aluminum layer(s). Suitable materials suitable for deposition as the transition metal layer include nickel, cobalt, ruthenium, iridium, titanium, and tungsten, among others. It is also contemplated that various combinations of transition metals may be deposited. In one embodiment, the type of transition metal utilized in the transition metal/aluminum layer(s) may be the type of transition metal utilized in the transition metal layer deposited on the transition metal/aluminum layers(s). For example, if a nickel/aluminum alloy material is deposited on the silicon containing substrate, a nickel transition metal layer is deposited on the nickel aluminum alloy material.

At operation 150, a second annealing process is performed to form a metal silicide material. In one embodiment, the second annealing process may be performed in-situ in the processing apparatus utilized to deposit the transition metal layer on the transition metal/aluminum layer(s). In another embodiment, the substrate may be transferred to a thermal processing chamber and the second annealing process may be performed. The second annealing process may be performed at a temperature of less than about 500° C., such as between about 200° C. and about 400° C. The second annealing process may be performed for an amount of time between about 60 seconds and about 1 hour, such as between about 10 minutes and about 30 minutes, for example, about 20 minutes.

It has been observed that the first annealing process performed on the transition metal/aluminum layer(s) does not form silicide materials at temperatures less than about 500° C., such as temperatures less than about 400° C. However, the second annealing process performed on the transition metal layer/transition metal/aluminum layer(s) does form silicide material at temperatures less than about 500° C.

It is believed that the transition metal layer deposition on the transition metal/aluminum layer(s) increased the free energy associated with the material toward an unstable material phase. The aluminum present in the transition metal aluminum layer(s) is believed to function as a catalyst for low temperature (i.e. below about 500° C., for example, below about 400° C.) silicide material formation. For example, the aluminum atoms diffuse away from the substrate during the second annealing process which creates a "vacancy wind effect" by which the transition metal layer atoms diffuse toward the substrate. Thus, the aluminum may function as a transition metal diffusion catalyst.

In addition, silicide materials formed by the methods described herein may exhibit a reduced sheet resistance compared to conventionally formed silicide materials. It is believed that the aluminum diffuses towards to the surface of the silicide material during the second annealing process. Thus, after the second annealing process is completed, an aluminum layer or aluminum ion concentration at the surface of the silicide material may be present. The aluminum layer may reduce the sheet resistance of the silicide material. In one example, the sheet resistance of a conventionally formed NiSi silicide material is about −1.087 $\Omega/cm^2$. Before the second annealing process of the embodiments described herein, the sheet resistance of a NiSi silicide material may be about $-1.181 \times 10^{-2}$ $\Omega/cm^2$. The sheet resistance of the NiSi silicide material after the second annealing process may be about $-2.265 \times 10^{-2}$ $\Omega/cm^2$. Thus, it can be seen that an improved sheet resistance may be achieved when forming silicide materials utilizing the methods described herein.

The aluminum layer may also function as an initiation or wetting layer for subsequent contact structure formation. For example, A tungsten contact structure may be deposited on the silicide material and the aluminum present at the surface of the silicide material may improve adhesion of the tungsten contact structure to the silicide material. It is believed that the aluminum layer may form an alloy with the material of the contact structure and may improve various other characteristics associated with contact structure formation processes.

The sheet resistance of the silicide material may also be advantageously influenced by the crystalline structure of the silicide material. For example, a NiSi silicide material formed according to the embodiments described herein may exhibit larger grain sizes when compared to conventionally formed silicide materials. The orthorhombic lattice vectors formed in the exemplary NiSi material were: a=5.23 Å, b=3.25 Å, and c=5.66 Å. The large grain size of the silicide material may improve the interface between the silicon containing substrate and the silicide material to provide improved interfacial electrical characteristics.

Figure 2A:
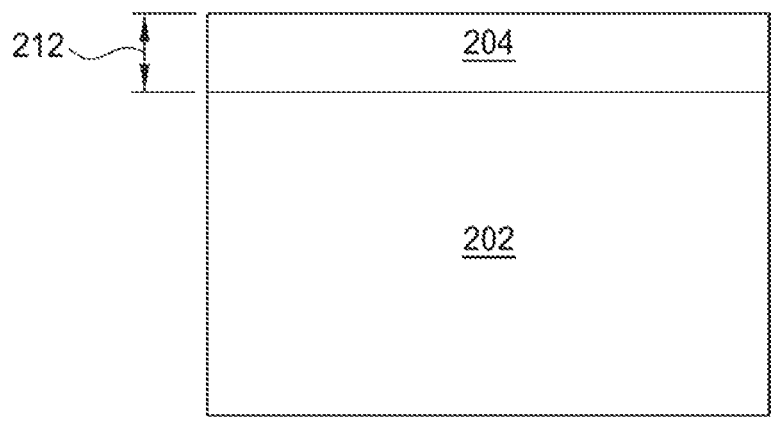
FIG. 2A illustrates a schematic, cross-sectional view of a substrate with a first layer deposited thereon according to embodiments described herein.

FIG. 2A illustrates a schematic, cross-sectional view of a substrate 202 with a first layer 204 deposited thereon according to embodiments described herein. The substrate 202 may be a silicon containing substrate, such as a crystalline silicon substrate or a silicon on insulator substrate. In the illustrated embodiment, the first layer 204 may be a single first layer. The first layer 204 may be formed from a transition metal/aluminum alloy. In this embodiment, the transition metal and the aluminum may be co-deposited to form the first layer 204. A thickness 212 of the first layer 204 may be between about 1 Å and about 30 nm, such as between about 1 nm and about 10 nm, for example, about 2 nm.

Figure 2B:
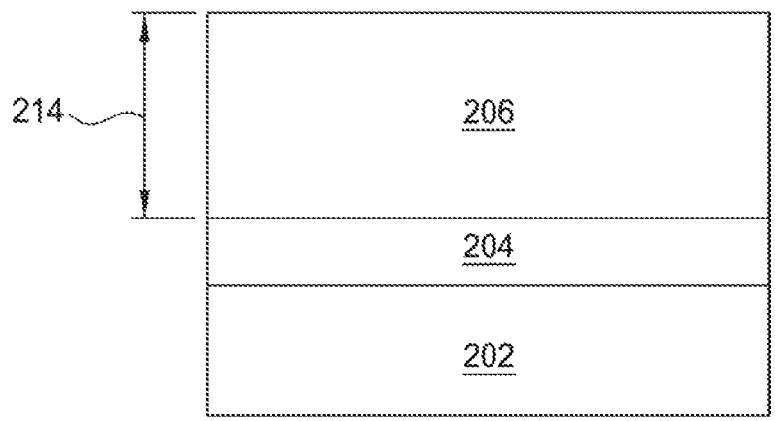
FIG. 2B illustrates a schematic, cross-sectional view of the substrate of FIG. 2A after deposition of a second layer on the first layer according to embodiments described herein.

FIG. 2B illustrates a schematic, cross-sectional view of the substrate 202 of FIG. 2A after deposition of a second layer 206 on the first layer 204 according to embodiments described herein. The second layer 206 may be formed from a transition metal and is generally deposited on and in contact with the first layer 204. A thickness 214 of the second layer 206 may be between about 10 nm and about 100 nm, such as between about 25 nm and about 75 nm, for example, about 50 nm.

Figure 2C:
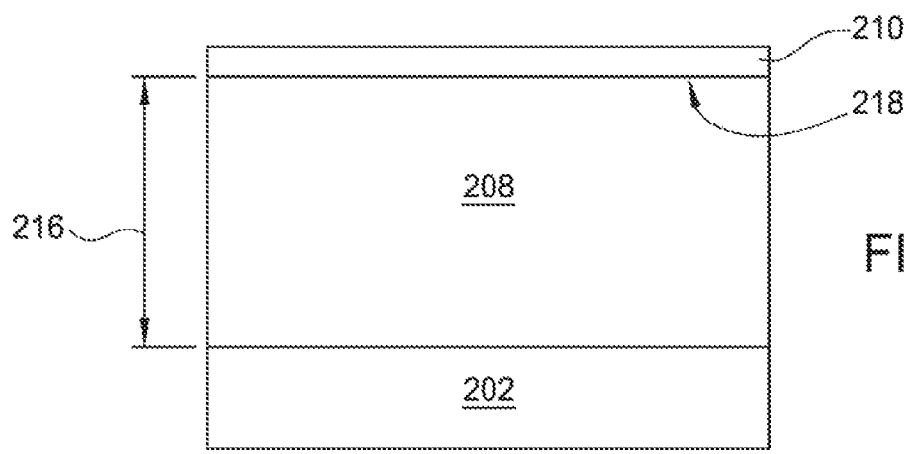
FIG. 2C illustrates a schematic, cross-sectional view of the substrate of FIG. 2B after performing an annealing process to form a silicide material according to embodiments described herein.

FIG. 2C illustrates a schematic, cross-sectional view of the substrate 202 of FIG. 2B after performing an annealing process to form a silicide material 208 according to embodiments described herein. The annealing process may be the second annealing process described above with regard to operation 150 and a thickness 216 of the silicide material 208 may be between about 20 nm and about 200 nm, such as between about 50 nm and about 150 nm, for example, about 50 nm. In one embodiment, the thickness 216 of the silicide material 208 may be greater than about two times the thickness 214 of the second layer 206. A third layer 210 may be formed on the surface 218 of the silicide material 208 opposite the substrate 202. The third layer 210 may be formed from aluminum which diffused away from the substrate 202 during the second annealing process.

Figure 3A:
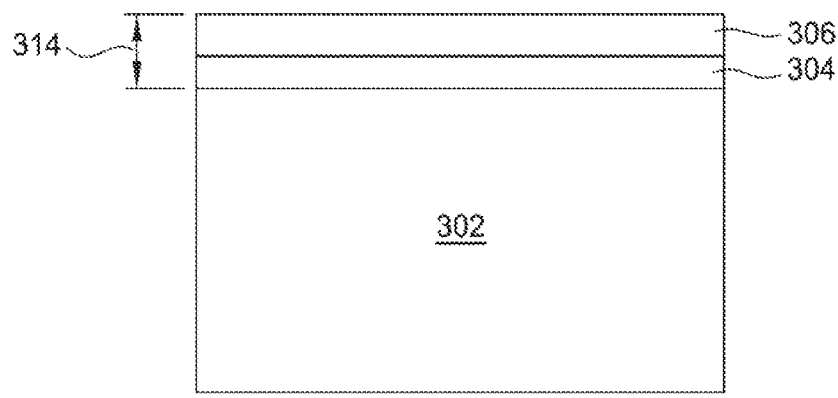
FIG. 3A illustrates a schematic, cross-sectional view of a substrate with one or more first layers deposited thereon according to embodiments described herein.

FIG. 3A illustrates a schematic, cross-sectional view of a substrate 302 with one or more first layers 304, 306 deposited thereon according to embodiments described herein. The substrate 302 may be a silicon containing substrate, such as a crystalline silicon substrate or a silicon on insulator substrate. In the illustrated embodiment, the first layers 304, 306 may be distinct layers deposited on one another. In one embodiment, the first layer 304 may be a transition metal material deposited on the substrate 302 and the first layer 306 may be an aluminum material deposited on the first layer 304. In another embodiment, the first layer 304 may be an aluminum material deposited on the substrate 302 and the first layer 306 may be a transition metal material deposited on the first layer 304. A thickness 314 of the first layers 304, 306 may be between about 1 Å and about 30 nm, such as between about 1 nm and about 10 nm, for example, about 2 nm.

Figure 3B:
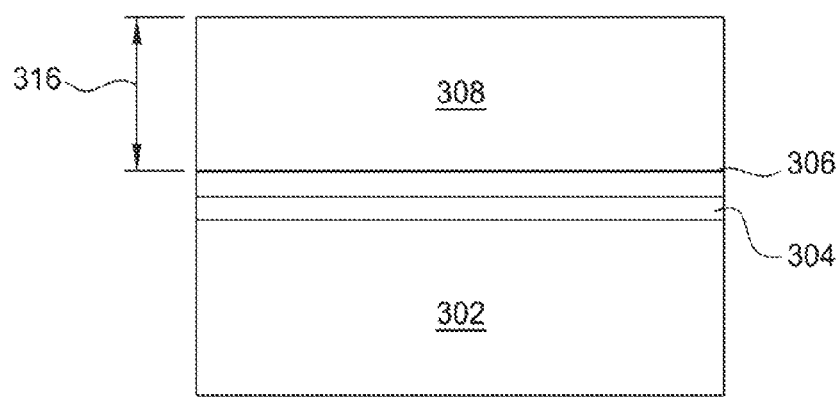
FIG. 3B illustrates a schematic, cross-sectional view of the substrate of FIG. 3A after deposition of a second layer on the one or more first layers according to embodiments described herein.

FIG. 3B illustrates a schematic, cross-sectional view of the substrate 302 of FIG. 3A after deposition of a second layer 308 on the one or more first layers 304, 306 according to embodiments described herein. The second layer 308 may be formed from a transition metal and is generally deposited on and in contact with at least one of the first layers 304, 306, generally, the topmost layer. A thickness 316 of the second layer 308 may be between about 10 nm and about 100 nm, such as between about 25 nm and about 75 nm, for example, about 50 nm.

Figure 3C:
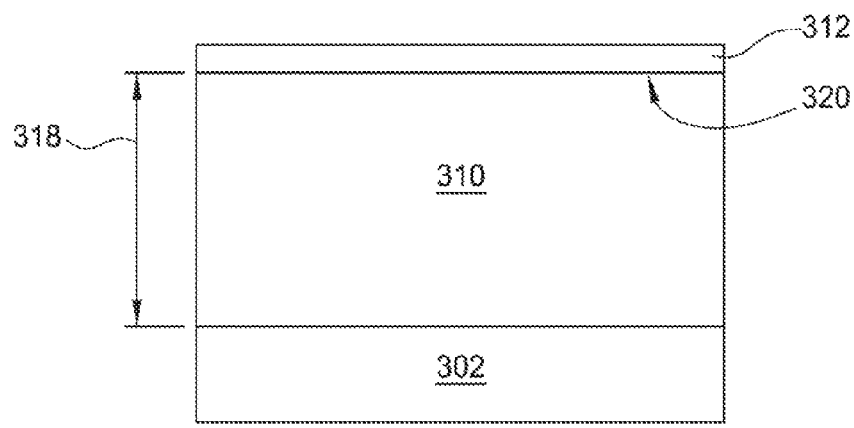
FIG. 3C illustrates a schematic, cross-sectional view of the substrate of FIG. 3B after performing an annealing process to form a silicide material according to embodiments described herein.

FIG. 3C illustrates a schematic, cross-sectional view of the substrate 302 of FIG. 3B after performing an annealing process to form a silicide material 310 according to embodiments described herein. The annealing process may be the second annealing process described above with regard to operation 150 and a thickness 318 of the silicide material 310 may be between about 20 nm and about 200 nm, such as between about 50 nm and about 150 nm, for example, about 50 nm. In one embodiment, the thickness 318 of the silicide material 310 may be greater than about two times the thickness 316 of the second layer 308. A third layer 312 may be formed on the surface 320 of the silicide material 310 opposite the substrate 302. The third layer 312 may be formed from aluminum which diffused away from the substrate 302 during the second annealing process.

FIG. 4A is a graph 400 illustrating resistivity as a function of aluminum content for aluminum nickel materials at various thicknesses according to embodiments described herein. Nickel/aluminum alloys are depicted and associated with aluminum compositional percentages at varying thicknesses. Pure nickel 402, AlNi$_3$ 404, AlNi 406, Al$_3$Ni$_2$ 408, Al$_3$Ni 410, and pure aluminum 412 are plotted on the graph 400 with suitable aluminum content compositional ranges. In one embodiment, AlNi 406 may have a suitable aluminum content between about 30% Al and about 60% Al. In one embodiment, the aluminum content is about 50% and the nickel content is about 50%. In this embodiment, the alloy may be selectively engineered to achieve a lower resistivity value and higher melting point than nickel alone.

FIG. 4B is a graph 420 illustrating resistivity as a function of aluminum content for aluminum cobalt materials at various thicknesses according to embodiments described herein. Cobalt/aluminum alloys are depicted and associated with aluminum compositional percentages at varying thicknesses. Pure cobalt 422, AlCo 424, Al$_3$Co 426, Al$_3$Co$_2$ 428, and pure aluminum 430 are plotted on the graph 420 with suitable aluminum content compositional ranges. In one embodiment, AlCo 424 may have a suitable aluminum content between about 10% Al and about 70% Al. In one embodiment, the aluminum content is about 50% and the cobalt content is about 50%. In this embodiment, the alloy may be selectively engineered to achieve a lower resistivity value and higher melting point than cobalt alone.

Figure 5B:
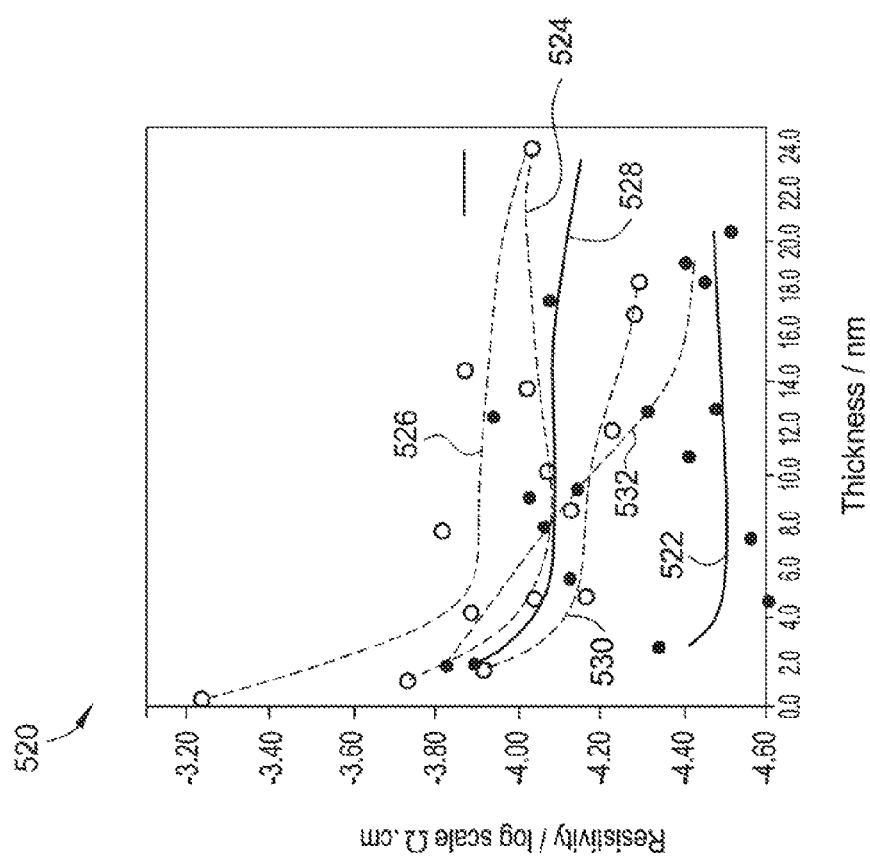
FIG. 5B is a graph illustrating resistivity as a function of aluminum content for an aluminum layer and a nickel layer according to embodiments described herein.
Figure 5A:
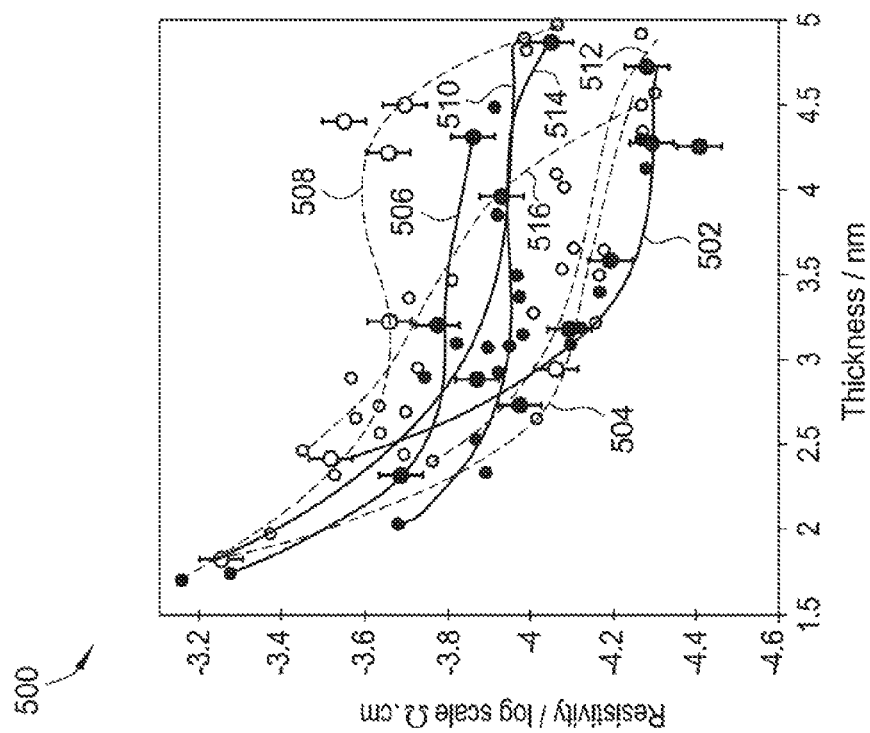
FIG. 5A is a graph illustrating resistivity as a function of aluminum content for a single aluminum nickel layer according to embodiments described herein.

FIG. 5A is a graph 500 illustrating resistivity as a function of aluminum content and layer thickness for a single co-deposited aluminum nickel layer according to embodiments described herein. Data 502 illustrates an aluminum nickel alloy having about 10% Al; Data 504 illustrates an aluminum nickel alloy having about 20% Al; Data 506 illustrates an aluminum nickel alloy having about 31% Al; Data 508 illustrates an aluminum nickel alloy having about 40% Al; Data 510 illustrates an aluminum nickel alloy having about 50% Al; Data 512 illustrates an aluminum nickel alloy having about 60% Al; Data 514 illustrates an aluminum nickel alloy having about 71% Al; and Data 516 illustrates an aluminum nickel alloy having about 80% Al. All of the data 502, 504, 506, 508, 510, 512, 514, and 516 are representative of nickel/aluminum alloys annealed at about 400° C.

FIG. 5B is a graph 520 illustrating resistivity as a function of aluminum content and layer thickness for an aluminum layer and a nickel layer according to embodiments described herein. Data 522 illustrates an aluminum nickel alloy having between about 12% Al and about 14% Al; Data 524 illustrates an aluminum nickel alloy having between about 24% Al and about 26% Al; Data 526 illustrates an aluminum nickel alloy having between about 40% Al and about 42% Al; Data 528 illustrates an aluminum nickel alloy having between about 48% Al and about 50% Al; Data 530 illustrates an aluminum nickel alloy having between about 60% Al and about 62% Al; and Data 532 illustrates an aluminum nickel alloy having between about 72% Al and about 74% Al. All of the data 522, 524, 526, 528, 530, and 532, are representative of nickel/aluminum alloys annealed at about 400° C.

When compared with graph 500, the data of graph 520 illustrate the relative similarity of resistivity values between co-deposited and layered alloys. However, it is contemplated that alloys formed from layered films may exhibit a lesser resistivity size effect than co-deposited films. This may be illustrated when comparing data 502 and data 522. It is believed that the reduced resistivity of the layered films is a result of reduced electron scattering due to specular reflection at the surface of the layered films.

FIG. 6A is a graph 600 illustrating resistivity values of silicide materials for an n-type NMOS device. Contact resistivity associated with contact structures are illustrated for various silicide material. A NiSi monosilicide material is represented by data 602; a NiSi$_2$ silicide material is represented by data 604; a TiSi$_2$ material is represented by data 606; and a CoSi$_2$ silicide material is represented by data 608. As illustrated, the NiSi monosilicide material 602 exhibits the lowest contact resistivity. Thus, monosilicide materials, such as NiSi, formed according to the embodiments described herein may provide for improved contact structure resistivity performance for n-type NMOS devices.

FIG. 6B is a graph 610 illustrating resistivity values of silicide materials for a p-type NMOS device. Contact resistivity associated with contact structures are illustrated for various silicide material. A NiSi monosilicide material is represented by data 612; a NiSi$_2$ silicide material is represented by data 614; a TiSi$_2$ material is represented by data 616; and a CoSi$_2$ silicide material is represented by data 618. As illustrated, the NiSi monosilicide material 612 exhibits the lowest contact resistivity. Thus, monosilicide materials, such as NiSi, formed according to the embodiments described herein may provide for improved contact structure resistivity performance for p-type NMOS devices.

In summation, improved silicide materials for contact structures and interconnect structures may be achieved utilizing the embodiments described herein. Co-deposited or layered transition metal/aluminum alloy materials may be utilized in combination with a transition metal layer deposited thereon according to the embodiments described herein. The aforementioned materials may be annealed one or more times at temperatures less than about 500° C. to form silicide materials having desirable resistivity characteristics. Accordingly, low temperature silicide material formation may be achieved. In addition, barrierless interconnect and contact structures may be formed utilizing silicide material formed according to the embodiments described herein.

While the foregoing is directed to embodiments of the present disclosure, other and further embodiments of the disclosure may be devised without departing from the basic scope thereof, and the scope thereof is determined by the claims that follow.

What is claimed is:

1. A silicide formation method, comprising:
depositing one or more first layers on a silicon containing substrate, wherein the one or more first layers comprise a transition metal aluminum alloy layer;
depositing a second layer comprising a transition metal on the one or more first layers, wherein a thickness of the second layer is between about 25 nm and about 75 nm; and
performing an annealing process after depositing the second layer at a temperature of less than about 500° C. to form a silicide material, wherein the silicide material has a thickness at least two times greater than the thickness of the second layer.

2. The method of claim 1, the transition metal aluminum alloy has a ratio of transition metal to aluminum that is about 1:1.

3. The method of claim 1, wherein the transition metal of the one or more first layers is selected from the group consisting of nickel, cobalt, ruthenium, iridium, titanium, tungsten, and combinations thereof.

4. The method of claim 1, wherein the transition metal of the one or more first layers is nickel.

5. The method of claim 1, wherein the transition metal of the second layer is selected from the group consisting of nickel, cobalt, ruthenium, iridium, titanium, tungsten, and combinations thereof.

6. The method of claim 1, wherein the transition metal of the second layer is nickel.

7. The method of claim 1, wherein the one or more first layers have a thickness of between about 1 nm and about 30 nm.

8. The method of claim 1, wherein annealing the substrate is performed at a temperature of between about 200° C. and about 400° C.

9. A silicide formation method, comprising:
removing an oxide material layer from a silicon containing substrate;
depositing an aluminum material layer on the silicon containing substrate;
depositing a first nickel material layer on the aluminum material layer;
performing a first annealing process at a temperature of less than about 500° C.;
depositing a second nickel material layer on the first nickel material layer; and
performing a second annealing process at a temperature of less than about 500° C. to form a nickel silicide material.

10. The method of claim 9, wherein the first annealing process and the second annealing process are performed at a temperature of between about 200° C. and about 400° C.

11. The method of claim 9, wherein the silicide material has a thickness at least two times greater than the thickness of the second nickel material layer.

12. A silicide formation method, comprising:
depositing one or more first layers on a silicon containing substrate, wherein the one or more first layers comprise a transition metal layer and an aluminum layer on the transition metal layer;
depositing a second layer comprising a transition metal on the one or more first layers wherein a thickness of the second layer is between about 25 nm and about 75 nm; and
performing an annealing process after depositing the second layer at a temperature of less than about 500° C. to form a silicide material, wherein the silicide material has a thickness at least two times greater than the thickness of the second layer.

13. The method of claim 12, wherein the transition metal of the one or more first layers is selected from the group consisting of nickel, cobalt, ruthenium, iridium, titanium, tungsten, and combinations thereof.

14. The method of claim 12, wherein the transition metal of the one or more first layers is nickel.

15. The method of claim 12, wherein the one or more first layers have a thickness of between about 1 nm and about 30 nm.

16. The method of claim 12, wherein annealing the substrate is performed at a temperature of between about 200° C. and about 400° C.

* * * * *